United States Patent
Turkot, Jr. et al.

(10) Patent No.: US 7,387,927 B2
(45) Date of Patent: Jun. 17, 2008

(54) REDUCING OXIDATION UNDER A HIGH K GATE DIELECTRIC

(75) Inventors: Robert B. Turkot, Jr., Hillsboro, OR (US); Justin K. Brask, Portland, OR (US); Jack Kavalieros, Portland, OR (US); Mark L. Doczy, Beaverton, OR (US); Matthew V. Metz, Hillsboro, OR (US); Uday Shah, Portland, OR (US); Suman Datta, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 313 days.

(21) Appl. No.: 10/939,227

(22) Filed: Sep. 10, 2004

(65) Prior Publication Data

US 2006/0057808 A1  Mar. 16, 2006

(51) Int. Cl.
*H01L 21/8238* (2006.01)

(52) U.S. Cl. ............ 438/216; 438/287; 438/591; 438/696; 438/725; 438/781

(58) Field of Classification Search ............. 438/216, 438/287, 591, 696, 725, 780–781
See application file for complete search history.

(56) References Cited

U.S. PATENT DOCUMENTS

| | | | | |
|---|---|---|---|---|
| 4,528,066 A | * | 7/1985 | Merkling et al. ....... | 438/696 |
| 5,378,653 A | * | 1/1995 | Yanagida ................ | 438/669 |
| 5,854,134 A | * | 12/1998 | Lan et al. .............. | 438/695 |
| 5,866,448 A | * | 2/1999 | Pradeep et al. ........ | 438/231 |
| 6,242,350 B1 | * | 6/2001 | Tao et al. .............. | 438/690 |
| 6,303,482 B1 | * | 10/2001 | Wu et al. ............... | 438/592 |
| 6,579,812 B2 | * | 6/2003 | Chen .................... | 438/780 |
| 6,667,243 B1 | * | 12/2003 | Ramsbey et al. ........ | 438/710 |
| 6,686,292 B1 | * | 2/2004 | Yang et al. ............ | 438/710 |
| 6,777,299 B1 | * | 8/2004 | Chiu et al. ............ | 438/303 |
| 6,875,706 B2 | * | 4/2005 | Lee et al. .............. | 438/745 |
| 6,955,177 B1 | * | 10/2005 | Chiu et al. ............. | 134/1.2 |
| 7,087,563 B2 | * | 8/2006 | Iwamoto et al. ........ | 510/175 |
| 2005/0112817 A1 | * | 5/2005 | Cheng et al. .......... | 438/219 |
| 2006/0071275 A1 | * | 4/2006 | Brask et al. ........... | 257/350 |
| 2006/0144421 A1 | * | 7/2006 | Matsuo et al. ......... | 134/2 |
| 2006/0189143 A1 | * | 8/2006 | Tsai et al. ............. | 438/700 |

(Continued)

FOREIGN PATENT DOCUMENTS

KR   200109535   * 12/2001

OTHER PUBLICATIONS

"Polymer Residue Removal Method in Poly Si Gate Self Alignment Process," IBM Technical Disclosure Bulletin; vol. 37, Issue No. 2A; Feb. 1, 1994; pp. 61-62.*

(Continued)

*Primary Examiner*—M. Wilczewski
*Assistant Examiner*—Toniae M. Thomas
(74) *Attorney, Agent, or Firm*—Trop, Pruner & Hu, P.C.

(57) ABSTRACT

A metal layer is formed on a dielectric layer, which is formed on a substrate. After forming a masking layer on the metal layer, the exposed sides of the dielectric layer are covered with a polymer diffusion barrier.

10 Claims, 4 Drawing Sheets

U.S. PATENT DOCUMENTS

2006/0226470 A1* 10/2006 Cho et al. .................... 257/315
2006/0287208 A1* 12/2006 Lee et al. .................... 510/175
2007/0051700 A1* 3/2007 Lee et al. ..................... 216/83
2007/0228002 A1* 10/2007 Geng et al. ................... 216/37

OTHER PUBLICATIONS

Chau et al., "A Method for Making a Semiconductor Device with a Metal Gate Electrode", U.S. Appl. No. 10/805,880, filed Mar. 22, 2004.

* cited by examiner

REDUCING OXIDATION UNDER A HIGH K GATE DIELECTRIC

BACKGROUND

The present invention relates to methods for making semiconductor devices, in particular, semiconductor devices that include high K gate dielectrics.

Metal oxide semiconductor (MOS) field-effect transistors with very thin gate dielectrics made from silicon dioxide may experience unacceptable gate leakage currents. Forming the gate dielectric from certain high dielectric constant dielectric (k) materials, instead of silicon dioxide, can reduce gate leakage. Because such a dielectric may not be compatible with polysilicon, it may be desirable to use metal gate electrodes in devices that include high-k gate dielectrics.

A metal gate electrode may be formed on a high-k dielectric layer by depositing a metal layer on the dielectric layer, masking the metal layer, and then removing the exposed part of that layer. A patterned polysilicon layer may be used to mask the metal layer, and a dry etch process may be used to remove the exposed part of that layer.

During subsequent high temperature steps in the presence of oxygen, the high-k dielectric layer transports oxygen laterally, oxidizing the underlying silicon. This lateral oxidation may result in oxide encroachment under the high-k dielectric. This encroachment increases the effective electrical gate thickness, reducing transistor performance.

Thus, there is a need for better ways to make metal gate/high K transistors.

Features shown in these figures are not intended to be drawn to scale.

DETAILED DESCRIPTION

After forming a dielectric layer on a substrate, a metal layer may be formed on the dielectric layer. After forming a masking layer on the metal layer, the sides of the dielectric layer are sealed with a diffusion barrier. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
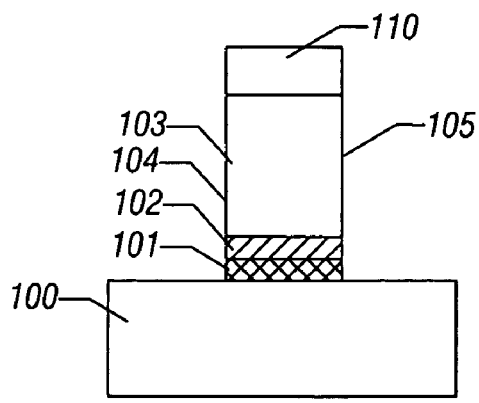
FIGS. 1a-1c represent cross-sections of structures that may be formed when carrying out an embodiment of the method of the present invention.
Figure 1B:
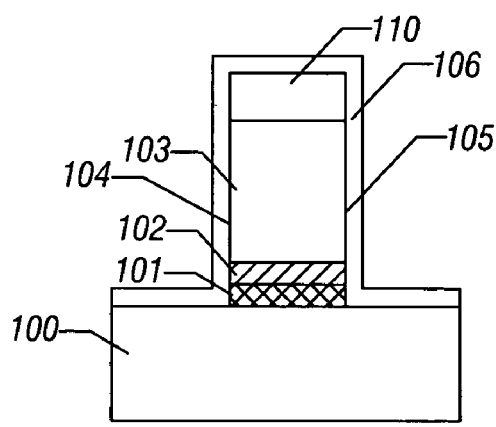
Figure 1C:
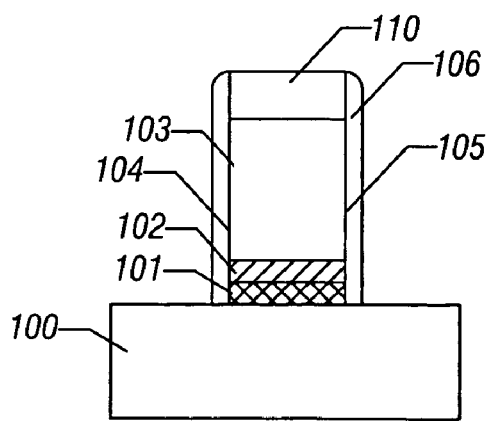

FIGS. 1a-1c illustrate structures that may be formed, when carrying out an embodiment of the method of the present invention. Initially, dielectric layer 101 is formed on substrate 100, metal layer 102 is formed on dielectric layer 101, and masking layer 103 is formed on metal layer 102, generating the FIG. 1a structure. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Dielectric layer 101 preferably comprises a high-k gate dielectric layer. By high-k it is intended to refer to dielectric materials having dielectric constants greater than 10. Some of the materials that may be used to make high-k gate dielectrics include: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form dielectric layer 101 are described here, that layer may be made from other materials that serve to reduce gate leakage.

Dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. The dielectric layer 101 may be less than about 60 Angstroms thick, for example, between about 5 Angstroms and about 40 Angstroms thick in one embodiment.

Although not shown in FIG. 1a, it may be desirable to form a capping layer, which may be no more than about five monolayers thick, on dielectric layer 101. Such a capping layer may be formed by sputtering one to five monolayers of silicon, or another material, onto the surface of dielectric layer 101. The capping layer may then be oxidized, e.g., by using a plasma enhanced chemical vapor deposition ("PECVD") process or a solution that contains an oxidizing agent, to form a capping dielectric oxide.

Although in some embodiments it may be desirable to form a capping layer on dielectric layer 101, in the illustrated embodiment metal layer 102 is formed directly on dielectric layer 101. Metal layer 102 may comprise any conductive material from which a metal gate electrode may be derived, and may be formed on dielectric layer 101 using well known PVD or CVD processes. Examples of n-type materials that may be used to form metal layer 102 include: hafnium, zirconium, titanium, tantalum, aluminum, and metal carbides that include these elements, i.e., titanium carbide, zirconium carbide, tantalum carbide, hafnium carbide and aluminum carbide. Examples of p-type metals that may be used to form metal layer 102 include: ruthenium, palladium, platinum, cobalt, nickel, and conductive metal oxides, e.g., ruthenium oxide. Although a few examples of materials that may be used to form metal layer 102 are described here, those layers may be made from many other materials.

Metal layer 102 may be thick enough to ensure that any material formed on it will not significantly impact its workfunction. The metal layer 102 may, for example, be between about 25 Angstroms and about 300 Angstroms thick, and, in one embodiment, may be between about 25 Angstroms and about 200 Angstroms thick. When metal layer 102 comprises an n-type material, layer 102 may have a workfunction that is between about 3.9 eV and about 4.2 eV. When metal layer 102 comprises a p-type material, layer 102 may have a workfunction that is between about 4.9 eV and about 5.2 eV.

After depositing metal layer 102 over dielectric layer 101, masking layer 103 is formed on metal layer 102. Masking layer 103 may be formed by depositing a polysilicon layer on metal layer 102 and then patterning the polysilicon layer to generate a patterned polysilicon layer. Such a polysilicon layer may be undoped or doped with either n-type or p-type impurities, may be deposited using conventional methods, and may be between about 500 Angstroms and about 2,000 Angstroms thick in one embodiment.

A patterned polysilicon layer may be created by first forming a hard mask that covers part of the polysilicon layer, and leaves part of that layer exposed. Such a hard mask may comprise silicon nitride, silicon dioxide, silicon oxynitride, or a nitrided silicon dioxide. The hard mask may be between about 100 Angstroms and about 500 Angstroms thick, and may be deposited and patterned using conventional techniques. The exposed parts of the polysilicon layer 103, layer 102, and layer 101 may then be removed using a dry etch process.

Hard mask 110 may be retained after masking layer 103 is formed to protect masking layer 103 during subsequent etching operations. After etching to form the FIG. 1a structure, first side 104 and second side 105 of masking layer 103 are covered with a polymer diffusion barrier 106, generating the FIG. 1b structure. Masking layer 103 is covered with such a layer to reduce oxidation of the layer 101 during subsequent temperature steps above 450° C. The layer 106 is formed on the metal layer 102, hard mask 110, and sides 104, 105 of masking layer 103 as the result of the deposition of etch by-products when the stack is etched. The film 106 is left behind as a result of the etch process. For example, a poly etch may include $Cl_2$, HBr, and $O_2$ containing gases, such as $CH_3F$, $CF_4$, and $C_4F_8$. Traditionally, the etch processes are tuned to deposited polymer films intentionally for the polymer diffusion barrier 106 as a diffusion barrier, the etching condition, in this case. The make-up of the barrier 106 is dependent upon the etch process gases and materials being etched. For a polysilicon stack, a generic mixture of primarily Si, O, C, and miscellaneous material dependent upon the etch gases is left behind. Layer 106 may be deposited onto metal layer 102, hard mask 110 and sides 104, 105, using a conventional CVD process. In one embodiment, layer 106 may have a thickness of between about 10 Angstroms and about 100 Angstroms. The layer 106 may be formed in situ in the dry etch chamber used to etch the stack shown in FIG. 1a.

After layer 106 is deposited, an anisotropic plasma dry etch process may be applied to remove a portion of the sacrificial diffusion barrier 106 from substrate 100 and the top of the hard mask 110, generating the FIG. 1c structure.

Process steps for completing the device, e.g., forming sidewall spacers on the gate electrode stack, source and drain regions and the device's contacts, are well known to those skilled in the art and will not be described in more detail here. In this regard, using dummy doped polysilicon layers for masking layer 103 may enable one to apply commonly used nitride spacer, source/drain, and silicide formation techniques, when completing the structure. During those subsequent process steps, hard mask 110 may be retained to prevent a significant part of masking layer 103 from being converted into a silicide. Conversely, if it is desirable to subsequently convert part or all of masking layer 103 into a silicide, then hard mask 110 must be removed beforehand.

Figure 3:
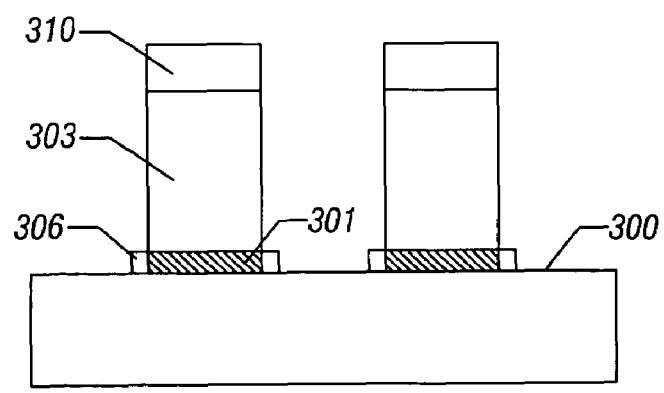
FIG. 3 represents a cross-section of a structure in accordance with a third embodiment of the present invention.

Referring to FIG. 3, in accordance with another embodiment of the present invention, a polymer diffusion barrier 306 may be selectively deposited on the dielectric layer 301 of a stack including a masking layer 303. The masking layer 303 may correspond to the layers 203 and 103 in the other embodiments and the masking layer 310 may correspond to the masking layers 210 and 110 in the other embodiments. Likewise, the dielectric layer 301 may correspond to the dielectric layers 101 and 201 in other embodiments.

The diffusion barrier 306 may be selectively formed on a substrate 300 and the dielectric layer 301 by etching using a gaseous plasma mixture that polymerizes onto the dielectric layer 30 on contact. For example, with fluorocarbon etch chemistries, polymer deposition can occur selectively on metal containing layers such as a layer 301 in the form of a metal oxide. This selective deposition is believed to be due to increased reactivity catalysis at the metal surface, due to its electrical properties.

FIGS. 2a-2h illustrate structures that may be formed, when carrying out a third embodiment of the method of the present invention. Initially, dielectric layer 201 is formed on substrate 200, generating the FIG. 2a structure. As indicated above, dielectric layer 201 preferably comprises a high-k gate dielectric layer. First metal layer 202 is then formed on dielectric layer 201, and part of that layer is masked by masking layer 203—generating the FIG. 2b structure. First metal layer 202 may comprise any conductive material from which a metal gate electrode may be derived. When first metal layer 202 comprises an n-type metal, it may be formed from any of the n-type materials identified above, using well known PVD or CVD processes, may have a workfunction that is between about 3.9 eV and about 4.2 eV, and, for example, is between about 25 Angstroms and about 300 Angstroms thick.

Masking layer 203 may be formed from conventional materials using conventional techniques. In one embodiment, masking layer 203 may comprise a silicon nitride or silicon dioxide hard mask, which may be formed using deposition and patterning techniques that are well known to those skilled in the art. After forming masking layer 203, a dry or wet etch process is applied to remove part of first metal layer 202, leaving part of dielectric layer 201 exposed. After first metal layer 202 is etched, the remainder of masking layer 203 is removed, generating the FIG. 2c structure.

Figure 2A:
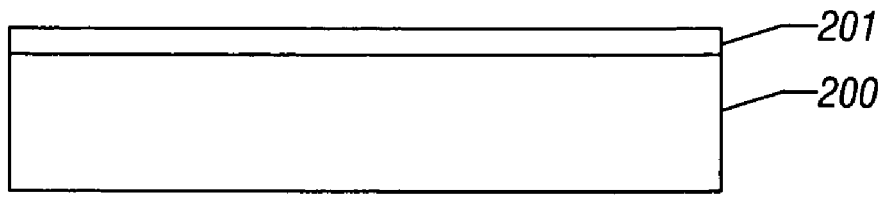
FIGS. 2a-2h represent cross-sections of structures that may be formed when carrying out a second embodiment of the method of the present invention.
Figure 2B:
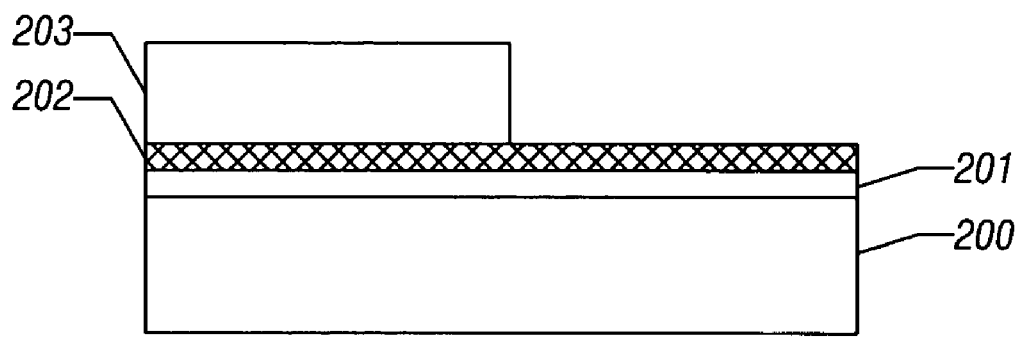
Figure 2C:
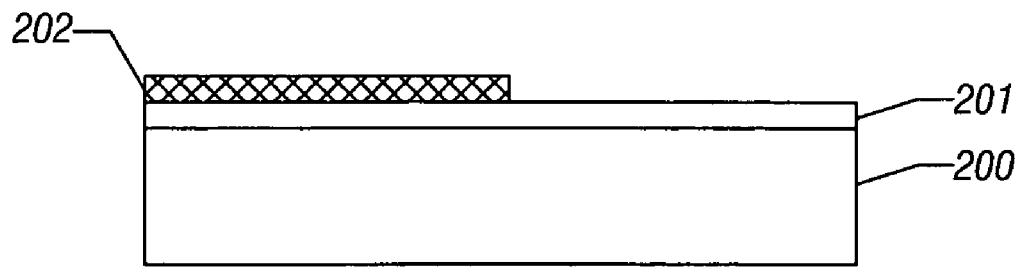
Figure 2D:
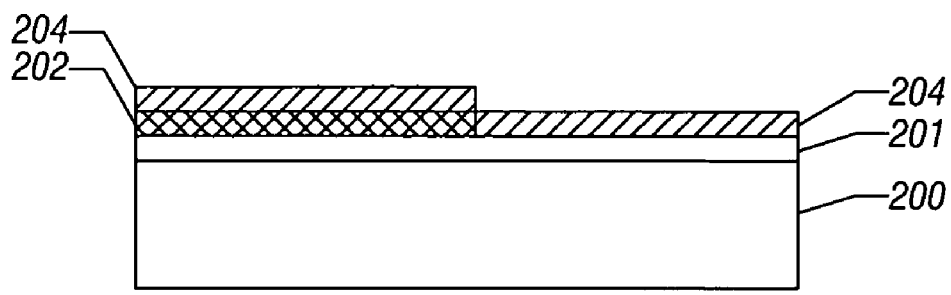

In this embodiment, second metal layer 204 is then deposited on first metal layer 202 and on the exposed part of dielectric layer 201—generating the FIG. 2d structure. When first metal layer 202 comprises an n-type metal, second metal layer 204 preferably comprises a p-type metal, e.g., one of the p-type metals identified above. When second metal layer 204 comprises a p-type material, it may be formed on dielectric layer 201 and first metal layer 202 using a conventional PVD or CVD process, for example, is between about 25 Angstroms and about 300 Angstroms thick and, in one embodiment, has a workfunction that is between about 4.9 eV and about 5.2 eV.

Figure 2E:
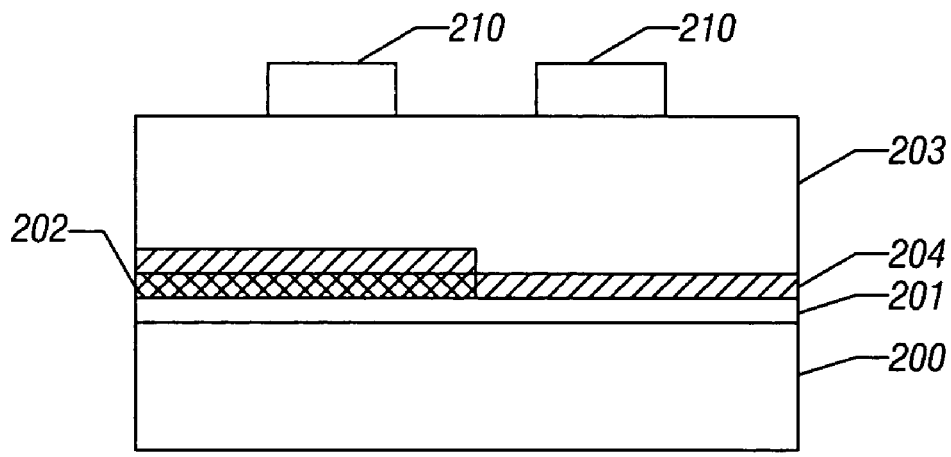
Figure 2F:
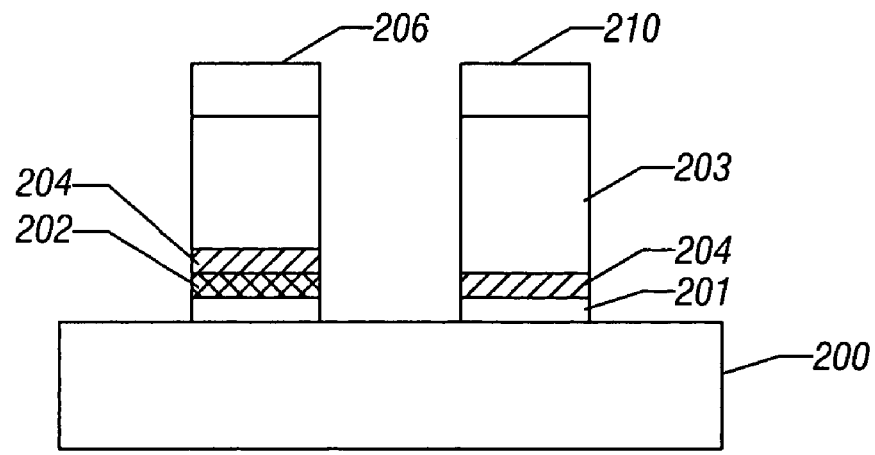

After depositing second metal layer 204 on first metal layer 202 and dielectric layer 201, masking layer 203 (e.g., a hard mask) is deposited on second metal layer 204. Masking layer 210 is then formed on masking layer 203 to define sections of masking layer 203 to be removed and sections to be retained. FIG. 2e represents a cross-section of the structure that results after masking layer 210 is formed on masking layer 203. In one embodiment, masking layer 203 comprises polysilicon, and masking layer 210 comprises silicon nitride or silicon dioxide. After layer 210 is formed, part of layer 203 is removed selective to second metal layer 204, e.g., using a dry etch process, to expose part of layer 204 and to create the FIG. 2*f* structure.

Figure 2G:
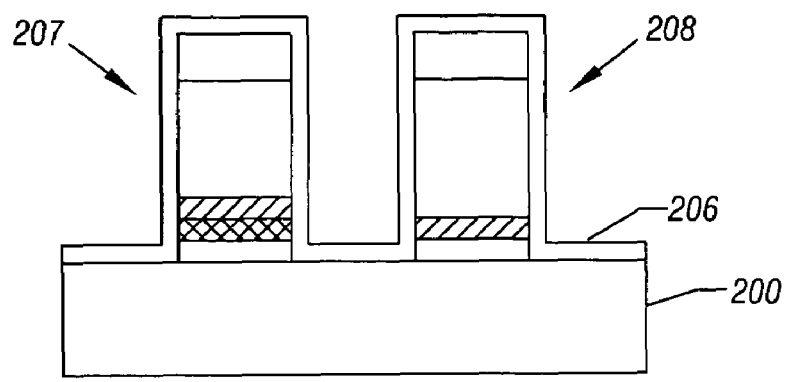

After etching masking layer 203, the sides of masking structures 207, 208 are lined with a polymer diffusion layer 206, generating the FIG. 2*g* structure. Sacrificial layer 206 may comprise any of the materials identified above, and may be formed using a conventional CVD process. After layer 206 is deposited, an anisotropic plasma dry etch process may be applied to the layer 206 over the substrate 200, generating the FIG. 2*h* structure.

Because process steps for completing the device are well known to those skilled in the art, they will be omitted here. As with the previously described embodiment, masking layers 210 may be removed prior to converting masking structures 207, 208 into a silicide, or retained to prevent significant portions of structures 207, 208 from being converted into a silicide during subsequent process steps.

Figure 2H:
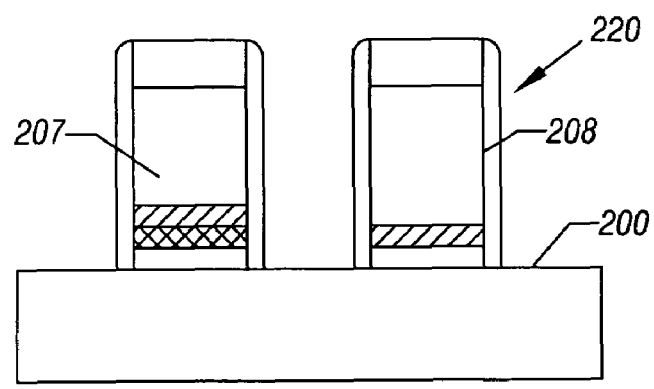

The three layer gate electrode stack of FIG. 2*h* may serve as the gate electrode for an NMOS transistor with a workfunction between about 3.9 eV and about 4.2 eV, while the two layer gate electrode stack may serve as the gate electrode for a PMOS transistor with a workfunction between about 4.9 eV and about 5.2 eV. Alternatively, the three layer gate electrode stack may serve as the gate electrode for a PMOS transistor, while the two layer gate electrode stack may serve as the gate electrode for an NMOS transistor.

The first metal layer should set the transistor's workfunction, regardless of the composition of the remainder of the gate electrode stack. For that reason, the presence of the second metal layer on top of the first metal layer in the three layer gate electrode stack, and the presence of a dummy doped polysilicon layer in either a three or two layer gate electrode stack, should not affect the workfunction of that stack in a meaningful way.

Although such a polysilicon layer should not affect the workfunction of an underlying metal layer, that polysilicon layer may serve as an extension of the transistor's contacts, as well as a support for the nitride spacers. It also defines the transistor's vertical dimension. Gate electrode stacks that include such a polysilicon layer are thus considered to be "metal gate electrodes," as are gate electrode stacks that include one or more metal layers, but do not include a polysilicon layer.

As illustrated above, the method of the present invention enables one to etch a metal layer without depositing undesirable residues on the sides of an overlying masking layer and without removing significant portions of the metal layer from beneath that masking layer. Although the embodiments described above provide examples of desirable metal layer etch processes, the present invention is not limited to these particular embodiments.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method comprising:
   forming on a substrate a pair of stacks including a polysilicon layer over a dielectric layer, said dielectric layer having exposed sides, one of said stacks to become an NMOS transistor and the other to become a PMOS transistor; and
   covering the exposed sides of said dielectric layer with a polymer diffusion barrier by selectively depositing said polymer diffusion layer at least on said exposed sides of said dielectric layer; and
   replacing said polysilicon layer with a metal layer.

2. The method of claim 1 including coating said stack with a layer of said polymer diffusion barrier and anisotropically etching said covered stack.

3. The method of claim 1 including forming said dielectric layer of a high dielectric constant material.

4. The method of claim 1 including forming a layer of dielectric material and a layer of polysilicon on said substrate and patterning and etching said layers to form said stack.

5. The method of claim 1 including forming an etch stop layer on said stack and covering said stack and said etch stop layer with a layer of a polymer diffusion barrier.

6. A method comprising:
   forming a polysilicon layer over a dielectric layer;
   etching said polysilicon layer and said dielectric layer and depositing a polymer diffusion barrier on the sides of said patterned polysilicon layer and dielectric layer exposed as a result of etching, wherein etching said dielectric layer includes etching all the way through said dielectric layer; and
   selectively depositing a polymer diffusion barrier only on the exposed sides of said dielectric layer.

7. The method of claim 6 including using a fluorocarbon etching gas.

8. The method of claim 6 including forming a dielectric layer in the form of a metal oxide.

9. The meted of claim 8 including using an etching gas which selectively deposits polymer on said metal oxide dielectric layer.

10. A method comprising:
    forming on a substrate a pair of stacks including a polysilicon layer over a dielectric layer, said dielectric layer having exposed sides, one of said stacks to become an NMOS transistor and the other to become a PMOS transistor;
    covering the exposed sides of said dielectric layer with a polymer diffusion barrier by selectively depositing said polymer diffusion layer at least on said exposed sides of said dielectric layer, wherein forming a stack including etching said polymer layer and said dielectric layer to the substrate; and
    selectively depositing a polymer diffusion barrier only on the exposed sides of said dielectric layer.

* * * * *